United States Patent [19]
Kaschmitter et al.

[11] Patent Number: 5,456,763
[45] Date of Patent: * Oct. 10, 1995

[54] SOLAR CELLS UTILIZING PULSED-ENERGY CRYSTALLIZED MICROCRYSTALLINE/POLYCRYSTALLINE SILICON

[75] Inventors: James L. Kaschmitter, Pleasanton, Calif.; Thomas W. Sigmon, Beaverton, Oreg.

[73] Assignee: Regents of the University of California, Oakland, Calif.

[ * ] Notice: The portion of the term of this patent subsequent to Sep. 13, 2011 has been disclaimed.

[21] Appl. No.: 219,487

[22] Filed: Mar. 29, 1994

[51] Int. Cl.$^6$ .............. H01L 31/04; H01L 31/0368; H01L 31/18
[52] U.S. Cl. .............. 136/258; 257/49; 257/75; 437/4; 437/173; 437/174; 437/19; 437/967
[58] Field of Search ............. 136/258 PC; 257/49, 257/51, 75; 437/4, 19, 173–174, 967

[56] References Cited

U.S. PATENT DOCUMENTS

| | | | |
|---|---|---|---|
| 3,914,856 | 10/1975 | Fang | 437/4 |
| 4,161,418 | 7/1979 | Morimoto et al. | 437/22 |
| 4,309,225 | 1/1982 | Fan et al. | 437/5 |
| 4,319,954 | 3/1982 | White et al. | 437/19 |
| 4,372,989 | 2/1983 | Menzel | 427/555 |
| 4,377,031 | 3/1983 | Goto et al. | 437/89 |
| 4,414,242 | 11/1983 | Nishimura et al. | 437/174 |
| 4,448,632 | 5/1984 | Akasaka | 437/17 |
| 4,510,015 | 4/1985 | Ellis et al. | 117/47 |
| 4,529,617 | 7/1985 | Chenevas-Paule et al. | 427/596 |
| 4,639,277 | 1/1987 | Hawkins | 148/33.3 |
| 4,649,624 | 3/1987 | Reedy | 437/3 |
| 4,655,850 | 4/1987 | Kakimoto et al. | 437/17 |
| 4,714,684 | 12/1987 | Sugahara et al. | 437/19 |
| 4,751,193 | 6/1988 | Myrick | 437/19 |
| 4,824,489 | 4/1989 | Cogan et al. | 136/256 |
| 5,346,850 | 9/1994 | Kaschmitter et al. | 437/81 |
| 5,366,926 | 11/1994 | Mei et al. | 437/173 |

OTHER PUBLICATIONS

H. S. Rauschenbach et al, Conference Record, 10th IEEE Photovoltaic Specialists Conf. (1973), p. 264.

Primary Examiner—Aaron Weisstuch
Attorney, Agent, or Firm—Henry P. Sartorio; L. E. Carnahan

[57] ABSTRACT

A process for producing multi-terminal devices such as solar cells wherein a pulsed high energy source is used to melt and crystallize amorphous silicon deposited on a substrate which is intolerant to high processing temperatures, whereby to amorphous silicon is converted into a microcrystalline/polycrystalline phase. Dopant and hydrogenization can be added during the fabrication process which provides for fabrication of extremely planar, ultra shallow contacts which results in reduction of non-current collecting contact volume. The use of the pulsed energy beams results in the ability to fabricate high efficiency microcrystalline/polycrystalline solar cells on the so-called low-temperature, inexpensive plastic substrates which are intolerant to high processing temperatures.

19 Claims, No Drawings

SOLAR CELLS UTILIZING PULSED-ENERGY CRYSTALLIZED MICROCRYSTALLINE/POLYCRYSTALLINE SILICON

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to electronic devices, particularly to the fabrication of electronic devices such as transistors and solar cells, and more particularly to the fabrication of multi-terminal electronic devices using a pulsed high energy source to melt and crystallize amorphous silicon deposited on a low temperature substrate and without excessive heating of the substrate.

In recent years substantial effort has been directed toward methods and apparatus for crystallizing amorphous material, in the fabrication of semiconductor material, with a beam of energy, such as produced by a continuous wave (CW) laser. These prior efforts are exemplified by U.S. Pat. No. 4,309,225 issued January 1982 to J.C.C. Fan et al.; U.S. Pat. No. 4,372,989 issued Feb. 8, 1983 to G. Menzel; U.S. Pat. No. 4,377,031 issued Mar. 22, 1983 to H. Goto et al.; U.S. Pat. No. 4,414,242 issued Nov. 8, 1983 to T. Nishimura et al.; U.S. Pat. No. 4,510,015 issued Apr. 9, 1985 to R. J. Ellis et al.; and U.S. Pat. No. 4,529,617 issued Jul. 16, 1985 to A. Chenevas-Paule et al.

Various methods have also been developed for changing the crystalline structure of silicon for use in semiconductors. These methods have utilized a seed layer, such as a layer of silicon dioxide ($SiO_2$) between the substrate, generally composed of silicon, and the amorphous silicon layer, for example, which is converted to polycrystalline silicon, for example, by application of electron beam or laser energy as produced by a CW laser, to the amorphous silicon layer. These development efforts are exemplified by U.S. Pat. No. 4,319,954 issued Mar. 16, 1982 to L. K. White et al.; U.S. Pat. No. 4,448,632 issued May 15, 1984 to Y. Abasaka; U.S. Pat. No. 4,649,624 issued Mar. 17, 1987 to R. E. Reedy; U.S. Pat. No. 4,655,850 issued Apr. 7, 1987 to S. Kakimoto et al.; U.S. Pat. No. 4,714,684 issued Dec. 22, 1987 to K. Sugahara et al.; and U.S. Pat. No. 4,751,193 issued Jun. 14, 1988 to J. J. Myrick.

More recent efforts have been directed to converting the amorphous silicon deposited on a silicon substrate to another phase and doping thereof using pulsed laser energy which pulses are long enough to melt the amorphous silicon and a thin layer of the silicon substrate beneath it, but short enough to prevent thermal damage to the silicon substrate and/or to material deposited on the opposite side of the silicon substrate. Such an approach is exemplified by U.S. Pat. No. 4,824,489 issued Apr. 25, 1989 to G. W. Cogan et al.

Pulsed laser processing (PLP) typically entails applying short (~35 ns) pulses of laser energy (0.1-1 $Jcm^{-2}$) to silicon or thin films of silicon, in vacuum or a dopant atmosphere. Gas-immersion laser doping (GILD) has been extensively developed for use in making shallow, highly doped ($>10^{20} cm^{-3}$) and activated semiconductor junctions. See K. H. Weiner et al., IEEE Electron Device Lett. 13, 369 (1992). Others have used laser processing to achieve low temperature processing for use in making thin film transistors. See K. Sera et al., IEEE Electron Device Lett. 36, 2868 (1989), and R. Z. Bachrach et al., J. Electron. Mater. 19, 241 (1990).

In these prior developments and research efforts to improve crystallinity of amorphous material, substrates of silicon or the so-called high temperature plastic or polymeric materials, such as polyimide (e.g. KAPTON, made by DuPont Corp.) have been used, which are capable of withstanding sustained processing temperatures of higher than about 200° C. For example, sustained processing temperatures of 800°–900° C. have been used with silicon substrates and processing temperatures of 400°–450° have been used with substrates of the high temperature plastic or polymeric materials.

The high temperature plastics are more expensive, have lower resistance to ultra-violet light, lower strength, and less transparency compared to commercial grade, transparent plastics referred to as low temperature plastics, which are incapable of withstanding sustained processing temperatures of higher than about 180°–200° C. Sustained processing is defined as a time period of longer than about $10^5$ ns.

It has been recognized by the inventors of the present invention that a substantial increase in efficiency, with reduced weight and cost would result in the fabrication of multi-terminal electronic devices, such as transistors and solar cells, using substrates of the so-called low temperature plastics and pulsed laser processing for crystallization and doping of amorphous silicon deposited on such low-temperature plastic. Thus, the present invention enables the use of inexpensive low-temperature, commercial grade plastics as substrates in the fabrication of solar cells, for example, whereby crystallization and doping of amorphous material deposited on such substrates could be carried out by using pulsed energy sources without heating the substrate to a temperature greater than about 180°–200° C. for a time period longer than about $10^5$ nanoseconds, thereby preventing thermal damage to the low temperature substrates.

SUMMARY OF THE INVENTION

An object of the invention is to provide a process in the fabrication of multi-terminal electronic devices such as solar cells and transistors which enables the use of substrates made of low temperature plastic.

A further object of the invention is to provide a process for fabricating solar cells or transistors which utilizes pulsed-energy for producing crystallized microcrystalline/polycrystalline silicon from films of amorphous silicon.

Another object of the invention is to utilize in the fabrication of solar cells, a substrate incapable of withstanding sustained processing temperatures of greater than 180°–200° C. on which is deposited amorphous material which is crystallized and doped using pulsed laser processing.

Other objects and advantages will become apparent from the following description. The invention involves a method or process in the fabrication of solar cells or transistors of crystallizing and doping amorphous material (i.e. silicon) deposited on a commercial-grade transparent plastic substrate using a pulsed high energy source. The short pulse duration allows for the high energy needed to crystallize and dope amorphous silicon ($\alpha$-Si) in a time period short enough to prevent heat propagation and build-up in the substrate, thus preventing thermal damage thereto. Such inexpensive, commercial-grade transparent plastic (referred to hereinafter as low temperature plastic) is incapable of withstanding sustained processing temperatures higher than about 180°–200° C., wherein sustained process is understood to mean a time period of longer than about $10^5$ ns. The use of the low-temperature plastics provide substrates which are less expensive, have greater strength and transparency compared to the so-called high temperature plastics, such as KAPTON, capable of withstanding sustained processing temperatures of 400°–450° C. Thus, this invention opens to the field of solar cell and transistor fabrication a selection of materials which includes substrates made from low-temperature plastics, high temperature plastics, and silicon; and pulsed laser processing can be utilized to crystallize and dope amorphous materials deposited on any of these types of substrates. Thus, this invention provides a significant advance in the field of solar cell fabrication, for example.

DETAILED DESCRIPTION OF THE INVENTION

The present invention is directed to a method or process in the fabrication of multi-terminal electron devices such as solar cells and transistors of crystallizing and doping amorphous material, such as silicon, on low-temperature plastic substrates using a pulsed high energy source. This invention enables high energy materials processing on plastic substrates which have low tolerance to high temperatures and thus enables components of solar cells or other electronic devices to be formed at low temperatures on low cost plastics. As set forth above, a low temperature plastic is defined as plastics which are incapable of withstanding sustained processing temperatures of higher than about 180°–200° C., with sustained processing meaning a time period of longer than about $10^5$ nanoseconds (ns). A significant advantage of pulsed laser processing (PLP) is that high (>900° C.), localized processing temperatures can be achieved in thin films with little accompanying temperature rise in the substrate, due to the short (~35 ns) pulses of laser energy (0.1-1 $Jcm^{-2}$).

The use of pulsed laser energy processing in the fabrication of solar cells to crystallize and dope amorphous silicon and to prevent thermal damage to an adhesive, for a superstrate of silicon and glass, which is incapable of withstanding exposure to excess temperatures, such as greater than 150° C., even for short periods of time, is described in above-referenced U.S. Pat. No. 4,824,489. The process for fabricating an entire solar cell will not be described herein since various solar cell fabrication processes are known, as exemplified by U.S. Pat. No. 4,824,489. The present invention may be used in the fabrication of various multi-terminal electric devices; however, the following description is directed to its use in solar cell fabrication and involves only a portion of the overall solar cell fabrication, namely, replacing the generally used silicon substrate with a low temperature plastic substrate and using pulsed laser processing for crystallizing and doping of amorphous material, such as silicon, deposited on the plastic substrate without thermal damage to the substrate. Thus, this invention, while reducing the cost of the prior substrates used in solar cell fabrication, opens the field to a choice of substrates not previously available due to the high sustained processing temperatures previously required in the fabrication process, as well as introducing pulsed laser processing in solar cell fabrication.

The high energy source allows the amorphous silicon, which has a high level of defects and broken bond states, to be converted into a microcrystalline/polycrystalline phase, resulting in a significant reduction in defect levels and recombination sites and a consequent increase in efficiency. Thus, using pulsed laser processing, low efficiency amorphous silicon is simply converted to a higher efficiency material, with or without lowered energy bandgap and for implementation in concentrator or large area planar arrays.

The pulsed energy processing of amorphous silicon ($\alpha$-Si) will form a microcrystalline or polycrystalline silicon layer or layer segments with improved mobilities, higher lifetimes, longer drift and diffusion lengths, and reduced resistivity, resulting in better devices which can be fabricated inexpensively due to the low cost of the low temperature plastic substrate. Dopant regions, junctions, or layer segments can be formed in-situ using a melt-doping process capable of forming shallow junctions. Similarly, hydrogen or other materials can be incorporated into the amorphous material by introducing the appropriate gas into the chamber during the pulsed laser processing. Polycrystalline silicon is considered to have a crystal size of >500° A., whereas microcrystralline silicon has a crystal size of 30°–250° A.

The unique aspects of this invention are that it provides for high energy materials processing on plastic substrate materials which have a low tolerance to high temperatures. The advantage of doing processing on these types of substrates is that portions of solar cells or other devices using thin-films can be fabricated at low temperatures on low cost plastics or other materials which may be transparent or have other desirable characteristics. Since $\alpha$-Si can be deposited at low temperatures, all processing steps for converting the $\alpha$-Si to the microcrystalline/polycrystalline phase can be performed at low temperatures on the substrate, since the time required to melt the deposited $\alpha$-Si or portions thereof is very short due to applying short pulses (~35 ns for example) of laser energy (0.1-1 $Jcm^{-2}$ for example, to the amorphous silicon in vacuum or a dopant gas atmosphere.

More specifically, in experimental verification of this invention, and by way of example only, a 1 micron thick layer of $\alpha$-Si was sputtered on a 2 mil thick sample of polyethersulfone (PES) plastic. The sample was the laser processed in a desirable atmosphere using a 308 nm XeCl excimer laser with 1 or more pulses at approximately 30 nsec/pulse and energy density of 150 $mJcm^{-2}$. The $\alpha$-Si was crystallized into micro-poly-crystalline silicon. PES is tolerant of sustained processing temperatures to about 205° C. Similar experiments have been carried out using other low temperature plastics such as ethylene-chlorotrifluoroethylene (E-CTFE) made by Ausimont U.S.A. Inc. under the trademark HALAK, ethylene-tetra-fluoroethylene (E-TFE) made by DuPont Corp. under the trademark TEFZEL. Also, the substrate may be made of polyvinylidene fluoride (PVDF), poly-tetra-fluoro-ethylene (PTFE), fluorinated ethylene propylene (FEP), and high density poly-ethylene (HDPE). The formulations of these plastics are incapable of withstanding sustained (greater than ~$10^5$ ns) time periods with processing temperatures higher than about 180°–200° C. Similar experiments have been carried out using various dopants for $\alpha$-Si, such as boron, phosphorous, and arsenic and for hydrogenation of the $\alpha$-Si using atmospheres of hydrogen or oxygen, using pulsed energy processing on low temperature substrates.

In accordance with the present invention, selective synthesis and doping of thin-film polycrystalline/microcrystalline silicon from $\alpha$-Si on low-temperature polymeric substrates has been carried out. An XeCl excimer laser (308 nm) was used to selectively crystallize and dope areas in the $\alpha$-Si films, which were sputtered or evaporated at room temperature onto a commercial-grade, transparent plastic which is intolerant of sustained processing temperatures higher than about 180°–200° C. The $\alpha$-Si/plastic substrate samples were exposed to pulsed laser radiation in three different environments, vacuum (<1 mT), 50 torr $BF_3$, and 50 torr $PF_5$, wherein the XeCl laser produced 30 ns (FWHM) pulses of 308 nm light totaling approximately one joule per pulse, with the energy density applied to the substrate being modulated by reflecting part of the energy away using beam-sputtering optics. Transmission election microscopy (TEM) and small area diffraction (SAD) were used to measure crystallinity and to confirm the integrity of the processed plastic substrates. Secondary ion mass spectroscopy (SIMS) was used to measure boron and phosphorous dopant profiles and to verify the absence of carbon diffusion from the plastic. The material produced has crystal sizes ranging from a few to hundreds of nanometers, depending upon the processing conditions, and the junction depths varied from tens to hundreds of nanometers.

In further verification of the invention, a low temperature plastic substrate consisting of E-CTFE having a thickness of 0.13 mm, was coated with a layer of 0.5 µm amorphous silicon (α-Si) by evaporating pure (99.999%) silicon onto the E-CTFE substrate at room temperature in an electron beam-heated evaporator. Samples have also been produced with sputtered silicon instead of evaporated silicon to form the α-Si layer. These thus produced samples were exposed to pulsed laser radiation in the above-referenced three different environments, vacuum (<1 mT), 50 torr $BF_3$, and 50 torr $PF_5$ using an XeCl excimer laser producing 30 ns pulses of 308 nm light totaling approximately one joule per pulse, as above described. Pulses were applied every five seconds for multi-pulse experiments. Energy applied to the substrate was measured for each sample using a Molectron Joule meter, and pulse-to-pulse stability of the energy was measured to be±5%. TEMs were made and SADs were used as above-described to measure crystallinity and plastic integrity, with satisfactory results. During the testing, the temperature of the substrates were obtained and heating above the 180°–200° C. range was for only a few microseconds.

While the above-referenced experimental examples utilized an XeCl excimer laser, other pulsed high energy sources such as KrF and ArF excimer lasers, e-beams, dye lasers, and YAG lasers may be utilized. Also, the α-Si layers may be deposited by plasma enhanced chemical vapor deposition (PECVD). Hydrogen or other materials can be incorporated into the formed crystalline structure by introducing the appropriate gas (hydrogen, oxygen, air) into the chamber at the time the α-Si is exposed to laser radiation.

It has thus been shown that the present invention provides an advance in the field of solar cells by enabling the use of inexpensive, low temperature, transparent, commercial-grade plastic substrates in place of the more costly silicon and high temperature plastics, and using pulsed laser processing for crystallizing and doping amorphous materials utilized in solar cell fabrication.

Selective crystallization and doping of pre-defined areas of silicon on a plastic substrate could allow for fabrication of various multi-terminal devices such as three-terminal semiconductor devices. A specific example would be for a Field Effect Transistor (FET). This process allows for the fabrication of thin film transistors for displays, such as in low cost, light weight conformal display materials.

While specific embodiments have been described, on specific materials, temperatures, parameters, etc. have been set forth to exemplify the invention, such are not intended to be limiting. Modifications and changes will become apparent to those skilled in the art. It is intended that the scope of this invention include such modifications and changes, and that the invention be limited only by the scope of the appended claims.

We claim:

1. In a process for fabricating multi-terminal electronic devices, the improvement comprising:

utilizing a substrate composed of a low temperature plastic incapable of withstanding sustained processing temperatures of higher than about 180°–200° C. and sustained processing time periods longer than about $10^5$ nanoseconds;

depositing a thin film of amorphous semiconductor material directly on the low temperature plastic substrate; and applying at least one pulse from a pulsed high energy source onto the thin film for a time period sufficient to change the crystallinity of the thin film without heating the substrate above a temperature of about 180°–200° C. for more than about "$10^5$" nanoseconds.

2. The improvement of claim 1, wherein the thin film of amorphous semiconductor material is silicon, and wherein the pulsed high energy is applied to at least sections of the amorphous silicon to convert same to microcrystalline/polycrystalline silicon.

3. The improvement of claim 1, which additionally includes positioning the low temperature plastic substrate having the thin film of amorphous semiconductor material deposited thereon in a controlled atmosphere during the application of pulsed high energy to the amorphous material.

4. The improvement of claim 3, wherein the controlled atmosphere is selected from the group consisting of air, hydrogen, oxygen, $BF_3$, $AsF_5$, and $PF_5$.

5. The improvement of claim 1, wherein the thin film of amorphous semiconductor material is deposited on the low temperature plastic substrate by a process selected from the group of sputtering, evaporation, and PECVD.

6. The improvement of claim 1, wherein the low temperature plastic substrate is made of material selected from the group of PES, E-CTFE, E-TFE, PVDF, PTFE, FEP, and HDPE.

7. The improvement of claim 1, wherein at least one pulse from a pulsed high energy source is provided from the group consisting of XeCl, KrF and ArF excimer lasers, electron-beams, dye lasers, and YAG lasers.

8. The improvement of claim 7, wherein the low temperature plastic substrate is composed of PES, the thin film of amorphous material is composed of amorphous silicon, and wherein the pulsed high energy source is an XeCl excimer laser.

9. The improvement of claim 8, wherein at least one pulse is of a 30 nsec duration with an energy density of 150 mJcm$^{-2}$.

10. The improvement of claim 7, wherein the low temperature plastic substrate is composed of E-CTFE, the thin film of amorphous semiconductor material is composed of amorphous silicon, and wherein the pulsed high energy source is an XeCl excimer laser.

11. The improvement of claim 10, wherein at least one pulse from a pulsed high energy source is applied onto the thin film of amorphous silicon in a controlled atmosphere.

12. The improvement of claim 11, wherein the controlled atmosphere is composed of dopant gases selected from the group of $BF_3$, $AsF_5$, and $PF_5$.

13. A solar cell constructed with the improvement of claim 1.

14. A solar cell of claim 13, wherein the low temperature plastic substrate is composed of material selected from the group of PES, E-CTFE, E-TFE, PVDF, PTFE, FEP, and HDPE.

15. The solar cell of claim 14, wherein the thin layer of amorphous semiconductor material is composed of amorphous silicon, and wherein the pulsed energy source is selected from the group consisting of XeCl, KrF, and ArF excimer lasers, electron-beams, dye lasers, and YAG lasers.

16. A process for fabricating solar cells, which includes:

providing a substrate composed of a low temperature plastic incapable of withstanding sustained processing temperatures of higher than about 180°–200° C. for more than about $10^5$" nanoseconds;

depositing on at least one side of the substrate a thin film of amorphous silicon; and applying one or more pulses, from a pulsed high energy source onto at least a portion of the amorphous silicon for converting same to microcrystalline/polycrystalline silicon.

17. The process of claim 16, wherein the one or more pulses from a pulsed high energy source applied onto at least a portion of the amorphous silicon is carried out in a controlled atmosphere selected from the group of air, hydrogen, oxygen, $BF_3$, $AsF_5$, and $PF_5$.

18. The process of claim 17, wherein the low temperature plastic substrate is composed of material selected from the group consisting of PES, E-CTFE, E-TFE, PVDF, PTFE, FEP, HDPE, and other low temperature polymeric materials.

19. The process of claim 18, wherein the pulsed high energy source is selected from the group consisting of XeCl, KrF and ArF excimer lasers, electron beams, dye lasers, and YAG lasers.

* * * * *